(12) United States Patent
Tu

(10) Patent No.: US 10,242,152 B2
(45) Date of Patent: Mar. 26, 2019

(54) METHOD AND APPARATUS FOR DETERMINING ATTITUDE OF AN OBJECT

(75) Inventor: Travis Tu, Shanghai (CN)

(73) Assignee: STMicroelectronics (China) Investment Co., Ltd., Shanghai (CN)

( * ) Notice: Subject to any disclaimer, the term of this patent is extended or adjusted under 35 U.S.C. 154(b) by 1817 days.

(21) Appl. No.: 13/615,209

(22) Filed: Sep. 13, 2012

(65) Prior Publication Data

US 2013/0030754 A1 Jan. 31, 2013
US 2017/0068775 A9 Mar. 9, 2017

(30) Foreign Application Priority Data

Sep. 14, 2011 (CN) .......................... 2011 1 0281435

(51) Int. Cl.

| G06F 15/00 | (2006.01) |
|---|---|
| G06F 17/11 | (2006.01) |
| G06F 17/16 | (2006.01) |
| G06F 19/00 | (2018.01) |
| G01C 21/16 | (2006.01) |
| G06F 17/50 | (2006.01) |

(52) U.S. Cl.
CPC ........... *G06F 19/00* (2013.01); *G01C 21/165* (2013.01); *G06F 17/50* (2013.01); *G06F 17/11* (2013.01); *G06F 17/16* (2013.01)

(58) Field of Classification Search
CPC ...... G06F 15/00; G06F 15/0275; G06F 17/16; G06F 17/11; G01C 21/16; G01C 21/165; G01C 21/20

USPC ................................................ 702/141, 150
See application file for complete search history.

(56) References Cited

U.S. PATENT DOCUMENTS 7,805,275 B2 * 9/2010 Kitamura et al. ............ 702/150

FOREIGN PATENT DOCUMENTS

| CN | 1680780 A | 10/2005 |
|---|---|---|
| CN | 101915580 A | 12/2010 |
| EP | 2 325 605 A1 | 5/2011 |
| JP | 2006-138739 A | 6/2006 |
| JP | 2006-300702 A | 11/2006 |

* cited by examiner

*Primary Examiner* — Gregory J Toatley, Jr.
*Assistant Examiner* — Lynda Dinh
(74) *Attorney, Agent, or Firm* — Seed IP Law Group LLP

(57) ABSTRACT

A method and apparatus for determining the attitude of an object is provided herein. The method for determining the attitude of the object comprises: receiving a gravity acceleration signal and a geomagnetic field signal, the gravity acceleration signal and the geomagnetic field signal changing with the attitude of the object accordingly; determining a gravity field representation in an object coordinate system according to the gravity acceleration signal, and determining a geomagnetic field representation in the object coordinate system according to the geomagnetic field signal; calculating a conversion parameter of coordinate system between to the object coordinate system and a terrestrial coordinate system according to the gravity field representation and the geomagnetic field representation in the object coordinate system; and determining the attitude of the object according to the conversion parameter of coordinate system.

16 Claims, 4 Drawing Sheets

METHOD AND APPARATUS FOR DETERMINING ATTITUDE OF AN OBJECT

TECHNICAL FIELD

This invention relates generally to computer technology, and more particularly to a method and an apparatus for determining attitude of an object.

BACKGROUND

Attitude Heading Reference System (AHRS) is a type of system for providing information relating to the attitude and moving direction of an object. The information relevant to the attitude of the object may be used in various applications such as automation, navigation, virtual reality, etc. Generally, the AHRS system contains a plurality of multi-axial sensors, such as gyroscopes, accelerometers and magnetometers. The AHRS system collects data information relevant to the attitude of the object (for example, angular velocity, acceleration and magnetic field intensity) via such sensors, calculates the attitude and/or moving direction of the object using specific algorithms and expresses such information.

In some conventional AHRS systems, the attitude of the object relative to an object coordinate system (i.e., a local coordinate system for the object itself) is generally expressed by Euler angles (i.e., nutation angle, precession angle and spin angle corresponding to respective rotation axes). However, an issue of Gimbal lock occurs when the Euler angles are used to express the attitude of the object or the rotation of the object. In other words, when the rotation of the object causes two rotation axes of the three rotation axes to be parallel with each other, the rotation around one rotation axis may overlay over the rotation around another rotation axis, thereby losing a rotational degree of freedom.

One way to avoid such Gimbal lock issue is to describe the attitude of the object using quaternion parameters. A quaternion is defined by a real number element and three other elements i, j, k, wherein i, j and k meet the equation $i^2+k^2+j^2=ijk=-1$. Each quaternion may be expressed with a linear combination of the elements i, j, k. As the quarternion expression has no singular point similar to the Euler angles, the Gimbal lock issue may not occur when using the quaternion expression to describe the attitude of the object. In the conventional AHRS systems, the angular velocity at which the object moves can be measured with the gyroscope, and further integrated to obtain the attitude of the object expressed with the quarternion.

However, the AHRS system based on the gyroscope is a relative AHRS system. The parameter of the attitude of the object at last time or last moment is needed when determining the attitude of the object. Considering various measurement errors of the gyroscope such as the actual sensitivity error, nonlinearity of sensitivity and the temperature drift of sensitivity, the information relevant to the attitude of the object provided by such relative AHRS system may accumulate measurement errors. Therefore, it is difficult for such system to describe the attitude of the object accurately over a long period.

Therefore, there is a need for a method and an apparatus for determining the attitude of an object stably and accurately.

SUMMARY

To solve at least one of the previous problems, in one aspect of the invention, there is provided a method for determining the attitude of an object, comprising: receiving a gravity acceleration signal and a geomagnetic field signal, the gravity acceleration signal and the geomagnetic field signal changing with the attitude of the object accordingly; determining a gravity field representation in an object coordinate system according to the gravity acceleration signal, and determining a geomagnetic field representation in the object coordinate system according to the geomagnetic field signal; calculating a conversion parameter of coordinate system between the object coordinate system and a terrestrial coordinate system according to the gravity field representation and the geomagnetic field representation in the object coordinate system; and determining the attitude of the object according to the conversion parameter of coordinate system.

In another aspect of the invention, there is provided an apparatus for determining the attitude of an object, comprising: a receiving module, for receiving a gravity acceleration signal and a geomagnetic field signal, the gravity acceleration signal and the geomagnetic field signal changing with the attitude of the object accordingly; a first determining module, for determining a gravity field representation in an object coordinate system according to the gravity acceleration signal, and determining a geomagnetic field representation in the object coordinate system according to the geomagnetic field signal; a conversion module, for calculating a conversion parameter of coordinate system between the object coordinate system and a terrestrial coordinate system according to the gravity field representation and the geomagnetic field representation in the object coordinate system; and a second determining module, for determining the attitude of the object according to the conversion parameter of coordinate system.

Different from the conventional technologies, according to the method and apparatus for determining the attitude of the object, each operation for determining the attitude of the object is independent of another operation at a different time. In this way, the deviation accumulated due to the measurement error of the sensors is reduced, and the attitude of the object can be stably and accurately determined during a long period. Moreover, the invention applies a quaternion conversion parameter of coordinate system to determine the attitude of the object. As the quaternion equation has no singular point like the Euler angles, the invention also avoids the issue of Gimbal lock.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
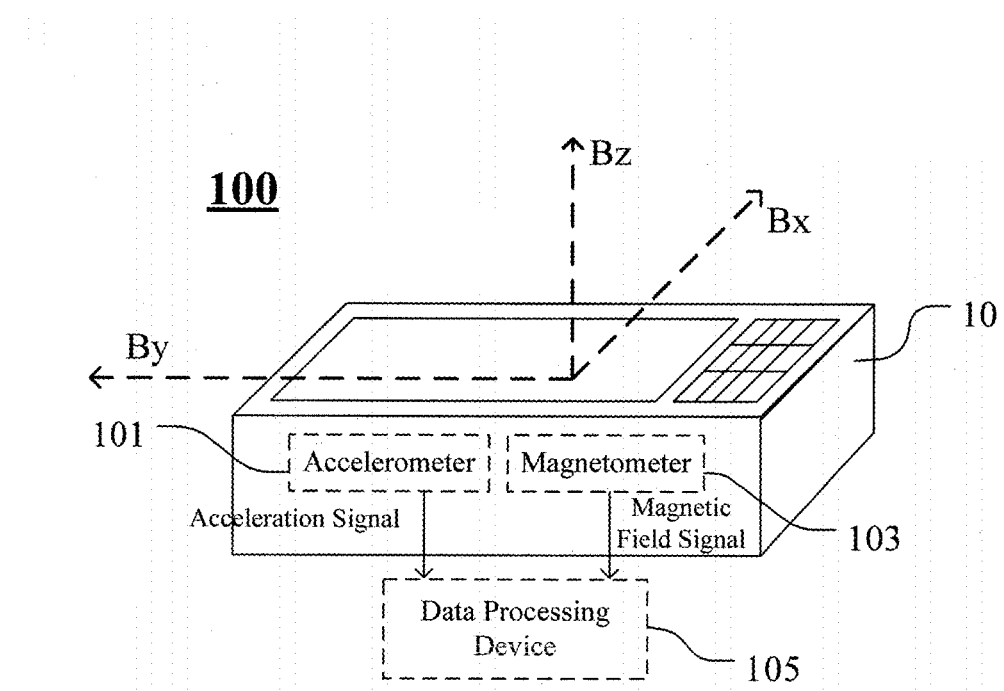
FIG. 1 shows an attitude heading reference system adapted to apply a method and an apparatus of the invention.

FIG. 1 shows an attitude heading reference system 100 adapted to apply a method and an apparatus of the invention. Generally, the AHRS system 100 is at least partially carried on a movable object 10. In FIG. 1, the object 10 is shown as a mobile communication terminal. However, it will be readily appreciated that the object 10 can be, for example, an industrial device, a visual reality device, a portable electric device or other electromechanical devices according to various applications.

FIG. 1 shows an object coordinate system of the object 10 (i.e. a local coordinate system for the object itself), which has three orthogonal coordinate axes, i.e., the $B_x$ axis, the $B_y$ axis and the $B_z$ axis. The origin of the object coordinate system locates at the center of the object 10, and the operation, such as rotation or translation, of the object 10 is performed according to the object coordinate system. When the object 10 performs the rotation or translation operation, the object coordinate system performs the rotation or translation operation as well.

From the foregoing, the object coordinate system changes with the attitude of the object 10, which is generally different from a basis coordinate system in which a measuring device resides as the measuring device may be stationary or may not change with the attitude of the object 10. Therefore, a terrestrial coordinate system which is stationary relative to the measuring device can be chosen as the basis coordinate system for describing the attitude of the object 10, and quaternion parameters in the basis coordinate system can be used to represent the attitude of the object 10. Specifically, in the basis coordinate system, the attitude of the object 10 can be represented as rotation around a normalized rotation axis $N(x_0, y_0, z_0)$ by an angle $\theta$, which corresponds to a quaternion parameter: $Q=(\cos(\theta/2), x_0*\sin(\theta/2), y_0*\sin(\theta/2), z_0*\sin(\theta/2))$.

Generally, the terrestrial coordinate system is chosen as the basis coordinate system for the measuring device. The terrestrial coordinate system has three orthogonal coordinate axes, and the position relationship for these three coordinate axes is in accordance with the right-hand rule. For example, the east-north-up (ENU) coordinate system has an E axis (towards the due east direction of the horizon plane), an N axis (towards the due north direction of the horizon plane) and a U axis (towards the zenith). For another example, the north-east-down (END) coordinate system has an N axis, an E axis and a D axis towards the earth's core). It is understood by those skilled in the art that, these terrestrial coordinate systems can be easily converted to each other, and therefore, the following embodiments will be elaborated using the ENU coordinate system as the terrestrial coordinate system, however the invention is not limited to such embodiments.

The AHRS system 100 comprises an accelerometer 101 and a magnetometer 103, which are carried on the object 10. The accelerometer 101 has at least three orthogonal measuring axes, along which the gravity acceleration is measured and a gravity acceleration signal is outputted. The magnetometer 103 has at least three orthogonal measuring axes, along which the geomagnetic field is measured and a geomagnetic field signal is outputted. It will be appreciated that, when the change of the attitude of the object 10 causes the direction of the measuring axes of the accelerometer 101 and the magnetometer 103 to vary, the gravity acceleration signal and the geomagnetic acceleration signal will change accordingly. In other words, the measurement values of components of the gravity acceleration and the geomagnetic field along respective measuring axes change as well.

Preferably, the three measuring axes of the accelerometer 101 and the magnetometer 103 overlay with the respective coordinate axes in the object coordinate system of the object 10, such that the measured gravity acceleration signal and the geomagnetic field signal correspond to the $B_x$ axis, the $B_y$ axis and the $B_z$ axis of the object coordinate system accordingly. It will be readily appreciated that, the measuring axes of the accelerometer 101 and the magnetometer 103 may deviate from the coordinate axes of the coordinate system by a specific angle, instead of overlay with such coordinate axes. Under such condition, the angular deviation should be taken into account when determining the attitude of the object with measurements of the sensors. For ease of illustration, the embodiments in the following paragraphs will be illustrated under the condition that the measuring axes of the accelerometer 101 and the magnetometer 103 both overlay with the respective coordinate axes of the object coordinate system, however the invention is not limited to such embodiments.

In practical applications, the AHRS system 100 further comprises a data processing device 105, which is configured to receive the gravity acceleration signal and the geomagnetic field signal outputted by the accelerometer 101 and the magnetometer 103, and to process these signals. In the embodiment shown in FIG. 1, the data processing device 105 is separate from the object 10, for example, it may be an remote data processing device such as a workstation, a personal computer or a server. The remote data processing device may be communicatively coupled to the accelerometer 101 and the magnetometer 103 via a wire connection or a wireless connection, to receive the measurement signals and process such signals. It will be readily appreciated that, in some other embodiments, the data processing device 105 may be carried on the object 10, for example, it may be a micro processing unit (MCU) coupled to the accelerometer 101 and the magnetometer 103.

It should be noted that, the AHRS system 100 applying the method and the apparatus of the invention determines the attitude of the object according to the gravity field and the magnetic field, and therefore the accelerometer 101 should measure the gravity acceleration under a stationary state or constant motion state (relative to the earth) when using the AHRS system 100 to determine the attitude of the object. In other words, no other force that may introduce acceleration and affect the measurement of the gravity acceleration is applied to the object 10. Moreover, the magnetometer 103 should measure the surrounding magnetic field of the location at which the object 10 resides under the condition that no other magnetic field other than the geomagnetic field exists, thereby avoiding the interference of such magnetic field to the measurement of the gravity field.

Figure 2:
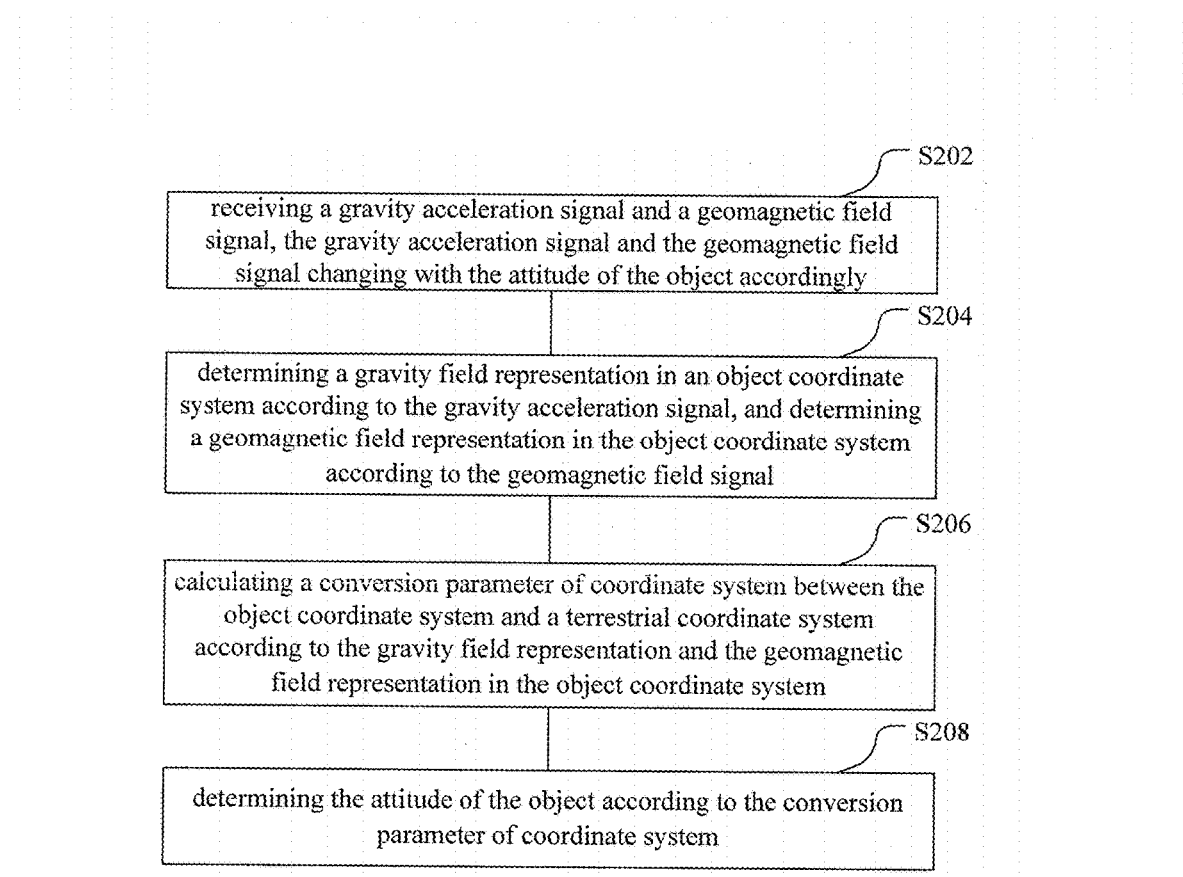
FIG. 2 shows a flow chart of a method for determining the attitude of an object according to one aspect of the invention.

FIG. 2 shows a flow chart of a method for determining the attitude of an object according to one aspect of the invention. It should be appreciated that, the steps recorded in the method may be performed in a different order, and/or performed in parallel. Moreover, the method may comprise additional steps and/or omit to perform one or more illustrated steps. The scope of the invention is not limited in such aspects.

As shown in FIG. 2, in step S202, a gravity acceleration signal and a geomagnetic field signal are received, wherein the gravity acceleration signal and the geomagnetic field signal change with the attitude of the object accordingly.

As mentioned above, the gravity acceleration signal represents the amplitude and the direction of the gravity acceleration applied to the object, which is measured by the accelerometer carried on the object. For example, a three-axis accelerometer has three orthogonal measuring axes. When the gravity acceleration applied to the object is being measured, it will project onto these measuring axes according to the angles between each of measuring axes and the direction of the gravity acceleration respectively. When these three measuring axes of the three-axis accelerometer overlay with three coordinate axes of the object coordinate system, the measured gravity acceleration signal corresponds to the deviation of the gravity field relative to the respective coordinate axes of the object coordinate system.

Similarly, the geomagnetic field signal represents the amplitude and the direction of the geomagnetic field of the location at which the object resides, which is measured by the magnetometer carried on the object. For example, a three-axis magnetometer has three orthogonal measuring axes. When the geomagnetic field is being measured, it will project onto these measuring axes according to the angles between each of measuring axes and the direction of the geomagnetic field respectively. When these three measuring axes of the three-axis magnetometer overlay with three coordinate axes of the object coordinate system, the measured geomagnetic field signal corresponds to the deviation of the geomagnetic field relative to the respective coordinate axes of the object coordinate system.

Afterwards, in step S204, a gravity field representation in an object coordinate system is determined according to the gravity acceleration signal, and a geomagnetic field representation in the object coordinate system is determined according to the geomagnetic field signal.

As mentioned above, the measured gravity acceleration signal corresponds to the deviation of the gravity field relative to the respective coordinate axes of the object coordinate system, and the measured geomagnetic field signal corresponds to the deviation of the geomagnetic field relative to the respective coordinate axes of the object coordinate system. Therefore, a gravity field representation and a geomagnetic field representation can be determined according to these measured signals.

The terrestrial coordinate system is substantially defined based on the direction of the gravity field and the direction relevant to the geomagnetic field. Thus, it is easy to determine a gravity field representation and a geomagnetic field representation in the terrestrial coordinate system. Furthermore, a relationship between the gravity field representation in the object coordinate system and the gravity field representation in the terrestrial coordinate system can be determined according to the gravity field representation in the object coordinate system. And a relationship between the geomagnetic field representation in the object coordinate system and the geomagnetic field representation in the terrestrial coordinate system can be determined according to the geomagnetic field representation in the object coordinate system.

Figure 3:
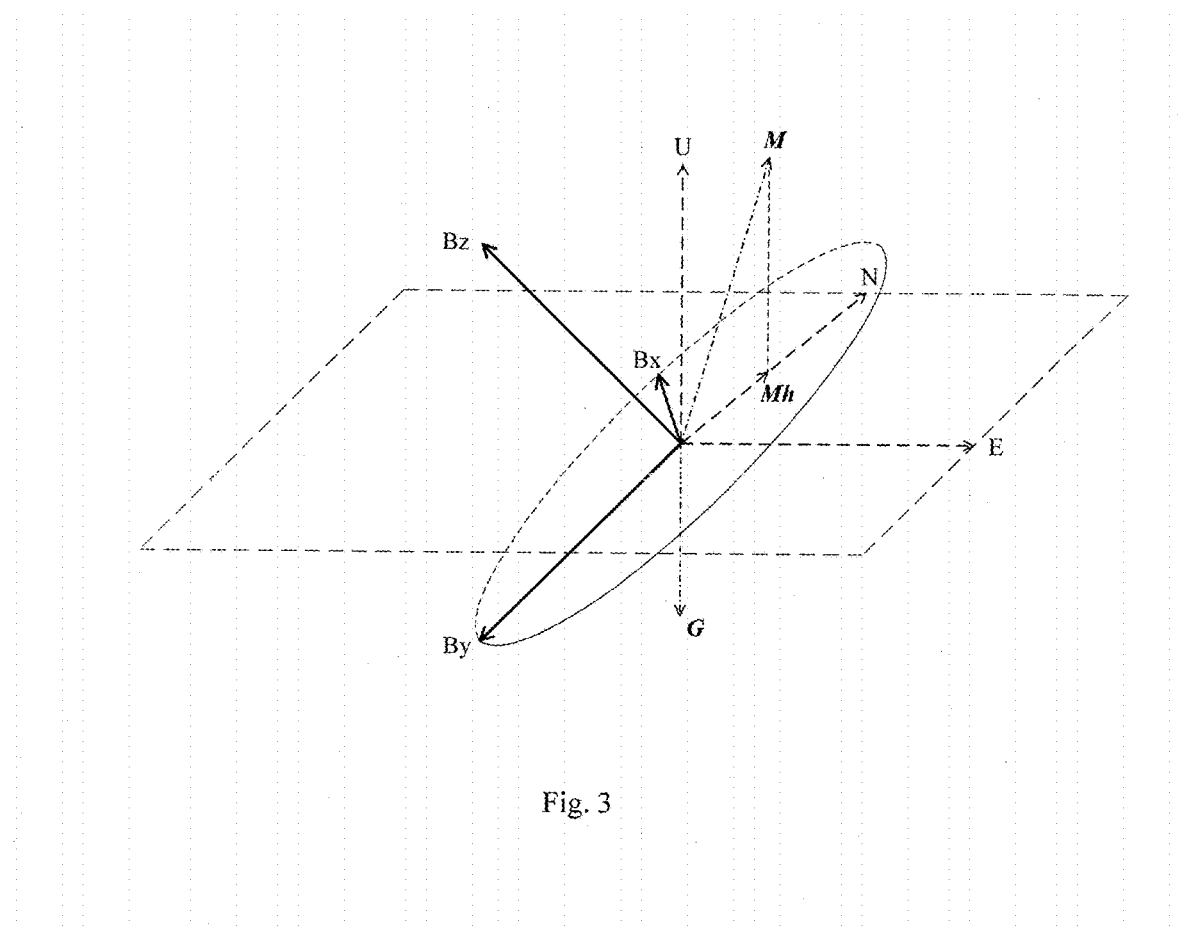
FIG. 3 shows respective representations of the gravity field and the geomagnetic field in an object coordinate system and a terrestrial coordinate system.

FIG. 3 shows respective representations of the gravity field and the geomagnetic field in an object coordinate system and a terrestrial coordinate system.

Specifically, the object coordinate system comprises three orthogonal coordinate axes, the $B_x$ axis, the $B_y$ axis and the $B_z$ axis. The gravity acceleration signal comprises measurement values: $G_x$, $G_y$ and $G_z$, which are projected onto these three coordinate axes respectively. Thus, the gravity field representation in the object coordinate system is a vector G from the origin (0, 0, 0) to the point ($G_x$, $G_y$, $G_z$). Similarly, the geomagnetic field signal comprises measurement values $M_x$, $M_y$, and $M_z$, which are projected onto the three coordinate axes respectively. Thus, the geomagnetic field representation in the object coordinate system is a vector M from the origin (0, 0, 0) to the point ($M_x$, $M_y$, $M_z$). Furthermore, the terrestrial coordinate system is generally relative to the horizon plane. For example, the N axis in the ENU coordinate system refers to the due north direction over the horizon plane (a tangent plane of the earth at the object's location). For the horizon plane, the geomagnetic field does not point to the due north, instead, there exists an angle along the U axis direction between the geomagnetic field and the tangent plane whose value varies with the geographic latitude. Therefore, for the geomagnetic field, its projection vector $M_h(M_{hx}, M_{hy}, M_{hz})$ on the horizon plane is easier to be illustrated. It will be appreciated that, the projection vector $M_h(M_{hx}, M_{hy}, M_{hz})$ of the geomagnetic field can be determined from ($G_x$, $G_y$, $G_z$) and ($M_x$, $M_y$, $M_z$), which will be elaborated below.

On the other hand, the gravity field and the geomagnetic field have corresponding representations in the terrestrial coordinate system such as the ENU coordinate system, the NED coordinate system or other terrestrial coordinate systems with three orthogonal coordinate axes. For example, the direction of the gravity field, which points to the earth core, overlays with the U axis in the ENU coordinate system. Thus, the direction of the gravity field can be represented as (0, 0, 1) in the ENU coordinate system. Similarly, the direction of the projection vector ($M_{hx}$, $M_{hy}$, $M_{hz}$) of the geomagnetic field overlays with the N axis in the ENU coordinate system. Thus, the direction of the projection vector ($M_{hx}$, $M_{hy}$, $M_{hz}$) of the geomagnetic field can be represented as (0, 1, 0) in the ENU coordinate system.

Moreover, the E axis in the ENU coordinate system can be represented as (1, 0, 0) in the ENU coordinate system, while its representation in the object coordinate system ($E_x$, $E_y$, $E_z$) is determined by the outer product of the vector $M_h$ representing the N axis direction and the vector G representing the U axis direction, i.e. ($M_{hy}G_z - G_y M_{hz}$, $M_{hz}G_x - G_z M_{hx}$, $M_{hx}G_y - G_x M_{hy}$), or determined according to the outer product of ($G_x$, $G_y$, $G_z$) and ($M_x$, $M_y$, $M_z$).

As mentioned above, in the terrestrial coordinate system, the geomagnetic field's projection vector ($M_{hx}$, $M_{hy}$, $M_{hz}$) on the horizon plane can be determined according to ($G_x$, $G_y$, $G_z$) and ($M_x$, $M_y$, $M_z$). Specifically, in the object coordinate system, the horizon plane is represented by the following horizon plane equation:

$$xG_x + yG_y + zG_z = 0 \quad (1)$$

The point ($M_{hx}$, $M_{hy}$, $M_{hz}$) locates on the horizon plane, i.e.

$$M_{hx}G_x + M_{hy}G_y + M_{hz}G_z = 0 \quad (2)$$

and a line from the point ($M_{hx}$, $M_{hy}$, $M_{hz}$) to the point ($M_x$, $M_y$, $M_z$) is represented by the following equation:

$$\frac{x - M_x}{M_{hx} - M_x} = \frac{y - M_y}{M_{hy} - M_y} = \frac{z - M_z}{M_{hz} - M_z} \quad (3)$$

And this line is perpendicular to the horizon plane, i.e.

$$\frac{G_x}{M_{hx}-M_x} = \frac{G_y}{M_{hy}-M_y} = \frac{G_z}{M_{hz}-M_z} = K \qquad (4)$$

$(M_{hx}, M_{hy}, M_{hz})$ can be represented with $(G_x, G_y, G_z)$ and $(M_x, M_y, M_z)$ by solving the equations (1), (2), (3) and (4), i.e.

$$K=-(G_xM_x+G_yM_y+G_zM_z)/(G_xG_x+G_yG_y+G_zG_z) \qquad (5)$$

$$M_{hx}=KG_x+M_x \qquad (6)$$

$$M_{hy}=KG_y+M_y \qquad (7)$$

$$M_{hz}=KG_z+M_z \qquad (8)$$

It should be noted that, the above calculation of $(M_{hx}, M_{hy}, M_{hz})$ is illustrative and not limiting, those skilled in the art can use other suitable ways to determine the representation of $(M_{hx}, M_{hy}, M_z)$.

Still referring to FIG. 2, in step S206, a conversion parameter of coordinate system between the object coordinate system and the terrestrial coordinate system is calculated according to the gravity field representation and the geomagnetic field expression in the object coordinate system.

Since the quaternion expression does not have a singular point like the Euler angle, the issue of Gimbal lock will not occur in the case that the attitude of the object is expressed by the quaternion parameters. Therefore, preferably, the conversion parameter of coordinate system is expressed and calculated using the quarternion parameter Q(a, b, c, d) (Q is preferably a unit quarternion parameter).

Specifically, a vector V(x, y, z) in the object coordinate system corresponds to a vector V'(x', y', z'). Accordingly, these two vectors are expressed in the quaternion form as:

$$V=(0,x,y,z) \qquad (9)$$

$$V'=(0,x',y',z') \qquad (10)$$

these two vectors satisfy the following coordinate system conversion equation:

$$V=QV'Q^{-1} \qquad (11)$$

wherein, $$Q=(a,b,c,d) \qquad (12)$$

$$Q^{-1}=(a,-b,-c,-d) \qquad (13)$$

The equation (11) can be solved to obtain the conversion parameter of coordinate system Q. Specifically, according to the quaternion multiply rules, the equations (9), (10), (12) and (13) can be substituted into the equation (3), then $$a^2+b^2+c^2+d^2=1 \qquad (14)$$

$$(a^2+b^2-c^2-d^2)x'+2(bc-ad)y'+2(bd+ac)z'=x \qquad (15)$$

$$2(bc+ad)x'+(a^2-b^2+c^2-d^2)y'+2(cd-ab)z'=y \qquad (16)$$

$$2(bd-ac)x'+2(cd+ab)y'+(a^2-b^2-c^2+d^2)z'=z \qquad (17)$$

As mentioned above, the vector representation in the object coordinate system are associated with the vector representation in the terrestrial coordinate system. The gravity field G is represented as $(G_x, G_y, G_z)$ in the object coordinate system, and represented as (0, 0, 1) in the terrestrial coordinate system. The geomagnetic field's projection vector $M_h$ on the horizon plane is represented as $(M_{hx}, M_{hy}, M_{hz})$ in the object coordinate system, and represented as (0, 1, 0) in the terrestrial coordinate system. The outer product E of the gravity field and the geomagnetic field is represented as $(E_x, E_y, E_z)$ in the object coordinate system, and represented as (1, 0, 0) in the terrestrial coordinate system.

Accordingly, the conversion equation of coordinate system can be solved using the relationship obtained in step S204. The above three relationships is substituted into the equations (15), (16) and (17), then:

$$2(bd+ac)=G_x \qquad (18)$$

$$2(cd-ab)=G_y \qquad (19)$$

$$(a^2-b^2-c^2+d^2)=G_z \qquad (20)$$

$$2(bc-ad)=M_{hx} \qquad (21)$$

$$(a^2-b^2+c^2-d^2)=M_{hy} \qquad (22)$$

$$2(cd+ab)=M_{hz} \qquad (23)$$

$$(a^2+b^2-c^2-d^2)=E_x \qquad (24)$$

$$2(bc+ad)=E_y \qquad (25)$$

The above equations are solved to obtain the expressions of a, b, c and d, thereby obtaining the expression of the conversion parameter of coordinate system Q(a, b, c, d). It should be noted that, some equations in the above equations (18)-(26) are abundant for solving the conversion parameter of coordinate system Q, which can be used to verify the solutions and delete the imaginary roots that are not in accordance with the initial condition (i.e. the three relationships). Therefore, the conversion parameter of coordinate system Q(a, b, c, d) may be solved by choosing two relationships among these three relationships, such as the relationship between the gravity field representations in the object coordinate system and in the terrestrial coordinate system and the relationship between the geomagnetic field representations in the object coordinate system and in the terrestrial coordinate system.

In an embodiment, a solution of the conversion parameter of coordinate system Q(a, b, c, d) comprises:

$$a=(f_2+f_3-f_4)/2;$$

$$b=(-f_2+f_3+f_4)/2$$

$$c=(2f_1-f_2-f_3+f_4)/2$$

$$d(f_2-f_3+f_4)/2$$

wherein $$f_1 = \pm\sqrt{\frac{|1+M_{hy}+G_x-E_z|}{2}} \quad f_2 = \pm\sqrt{\frac{|1+G_z+E_y-M_{hx}|}{2}}$$

$$f_3 = \pm\sqrt{\frac{|1+E_x+M_{hz}-G_y|}{2}} \quad f_4 = \pm\sqrt{\frac{|1-M_{hy}+G_x+E_z|}{2}}$$

$$f_5 = \pm\sqrt{\frac{|1-G_z+E_y+M_{hx}|}{2}} \quad f_6 = \pm\sqrt{\frac{|1-E_x+M_{hz}+G_y|}{2}}$$

wherein a is greater than 0, and a, b, c, d satisfy the requirement that Q is a unit quaternion vector.

And then in step S208, the attitude of the object is determined according to the conversion parameter of coordinate system.

Specifically, the conversion parameter of coordinate system Q represents the conversion relationship between the object coordinate system and the terrestrial coordinate system. For the object at a location of the earth, the directions of the coordinate axes in the terrestrial coordinate system, such as the N axis, the E axis and the U axis in the ENU coordinate system, are certain. On the other hand, the object coordinate system is constant for the object itself. Therefore, the conversion parameter of coordinate system Q actually corresponds to the attitude of the object relative to the terrestrial coordinate system, and different conversion parameters of coordinate system Q represent different attitudes of the object in the terrestrial coordinate system.

In a preferable embodiment, in step S208, the object may be displayed according to the conversion parameter of coordinate system. For example, the object is displayed in a display interface of a monitoring device, wherein the display interface has a basis coordinate system like the terrestrial coordinate system. Then, the attitude of the object can be adjusted using the conversion parameter of coordinate system.

For example, a three dimensional graphic model of the object can be modeled and displayed using a graphic application interface OpenGL. When the attitude of the object is determined, a function glRotatef($\theta$, $x_0$, $y_0$, $z_0$) in the OpenGL function database may be used to rotate the three dimensional graphic model of the object so as to display the attitude of the object. Four parameters of the function can be determined with the parameters a, b, c and d of the conversion parameter of coordinate system Q, i.e.

$$\theta = 2\arccos(a)$$
$$x_0 = \frac{b}{\sin(\theta/2)}$$
$$y_0 = \frac{c}{\sin(\theta/2)}$$
$$z_0 = \frac{d}{\sin(\theta/2)}$$

In this way, the attitude of the object can be determined and displayed in the graphic interface. It should be noted that, the description relating to displaying the attitude of the object is illustrative and not limiting. In practical applications, the attitude of the object can be displayed by DirectX or other graphic application interfaces.

Figure 4:
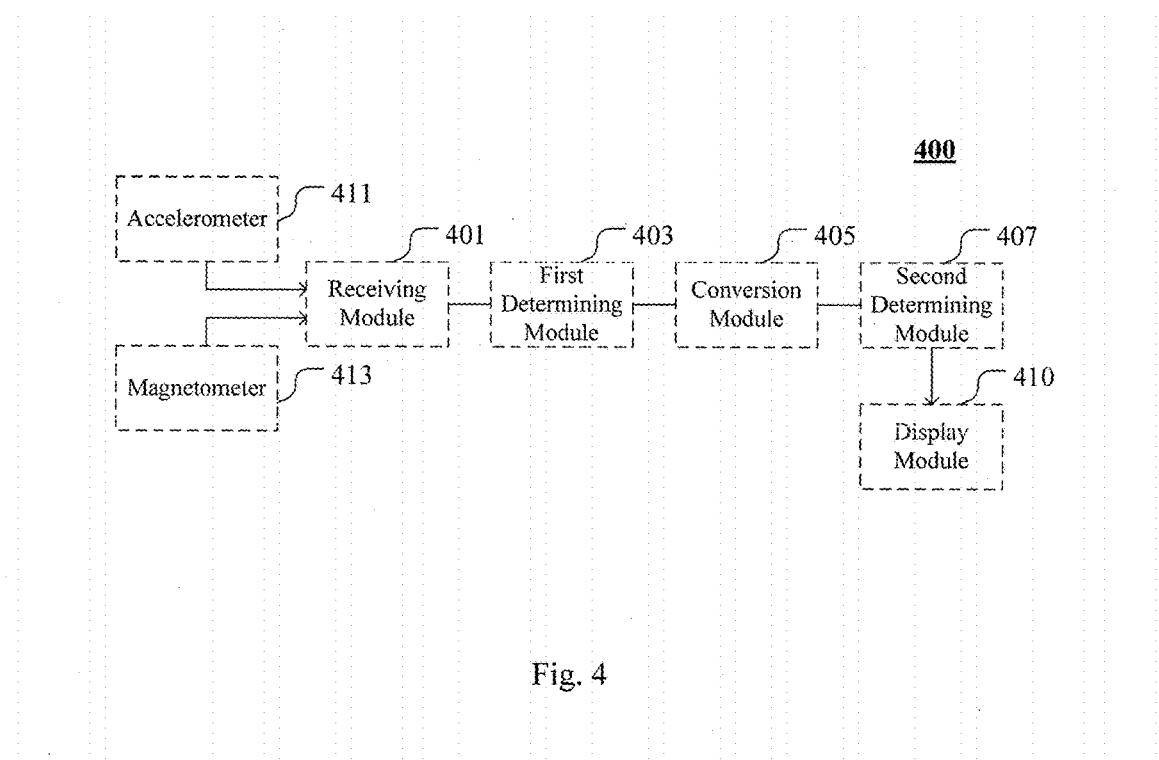
FIG. 4 shows a block diagram of an apparatus for determining the attitude of an object according to another aspect of the invention.

FIG. 4 shows a block diagram of an apparatus 400 for determining the attitude of an object according to an aspect of the invention. The apparatus 400 comprises:

a receiving module 401, for receiving a gravity acceleration signal and a geomagnetic field signal, the gravity acceleration signal and the geomagnetic field signal changing with the attitude of the object accordingly;

a first determining module 403, for determining a gravity field representation in an object coordinate system according to the gravity acceleration signal, and determining a geomagnetic field representation in the object coordinate system according to the geomagnetic field signal;

a conversion module 405, for calculating a conversion parameter of coordinate system between the object coordinate system and a terrestrial coordinate system according to the gravity field representation and the geomagnetic field representation in the object coordinate system; and a second determining module 407, for determining the attitude of the object according to the conversion parameter of coordinate system.

Hereinafter, the apparatus for determining the attitude of the object according to the invention is elaborated.

First, the receiving module 401 receives a gravity acceleration signal from an accelerometer 411 and a geomagnetic field signal from a magnetometer 413. Both of the accelerometer 411 and the magnetometer 413 are carried on the object. When the attitude of the object changes, the directions of the accelerometer 411 and the magnetometer 413 change as well. However, as the direction of the geomagnetic field and the gravity field do not change, the measurement values of the geomagnetic field and the gravity field along respective measuring axes change accordingly.

In an embodiment, the accelerometer 411 has at least three orthogonal measuring axes such that the gravity acceleration signal at least comprises measurement values of the gravity acceleration measured along three orthogonal measurement axes. The magnetometer 413 has at least three orthogonal measuring axes such that the geomagnetic field signal at least comprises measurement values of the geomagnetic field measured along three orthogonal measurement axes. Preferably, the measuring axes of the accelerometer 411 and the magnetometer 413 overlay with the coordinate axes of the object coordinate system.

Afterwards, the receiving module 401 provides the gravity acceleration signal and the geomagnetic field signal to the first determining module 403.

Specifically, the measured gravity acceleration signal corresponds to the deviation of the gravity field relative to the respective coordinate axes of the object coordinate system, and the measured geomagnetic field signal corresponds to the deviation of the geomagnetic field relative to the respective coordinate axes of the object coordinate system. Thus, the representations of the gravity field and the geomagnetic field in the object coordinate system can be determined using the measurement values of components of these signals along respective measuring axes. For example, the gravity acceleration signal comprises measurement values $G_x$, $G_y$ and $G_z$ which are projected onto these three measuring axes, and thus the gravity field representation in the object coordinate system is a vector G from the origin (0, 0, 0) to the point ($G_x$, $G_y$, $G_z$). The geomagnetic field signal comprises measurement values $M_x$, $M_y$ and $M_z$, which are projected onto the three coordinate axes respectively. Thus, the geomagnetic field representation in the object coordinate system is a vector M from the origin (0, 0, 0) to the point ($M_x$, $M_y$, $M_z$).

On the other hand, the terrestrial coordinate system is actually defined by the gravity field and the projection of the geomagnetic field over the horizon plane. Therefore, the gravity field and the geomagnetic field are easy to be expressed in the terrestrial coordinate system. Accordingly, a relationship between the gravity field representation in the object coordinate system and a gravity field representation in the terrestrial coordinate system can be determined according to the gravity field representation in the object coordinate system. And a relationship between the geomagnetic field representation in the object coordinate system and a geomagnetic field representation in the terrestrial coordinate system according to the geomagnetic field representation in the object coordinate system. In an embodiment, the terrestrial coordinate system is the ENU coordinate system, the gravity field representation corresponds to the up axis of the ENU coordinate system, and the projection vector of the geomagnetic field on the horizon plane corresponds to the north axis of the ENU coordinate system.

Then the first determining module 403 provides the gravity field representation and the geomagnetic field representation in the object coordinate system to the conversion module 405, such that the conversion module 405 determines the relationship between the geomagnetic field representation in the object coordinate system and the geomagnetic field representation in the terrestrial coordinate system, and the relationship between the gravity field representation in the object coordinate system and the gravity field representation in the terrestrial coordinate system. By using such relationships, the conversion module 405 can calculate a conversion parameter of coordinate system between the object coordinate system and the terrestrial coordinate system. In an embodiment, the conversion module 405 calculates the conversion parameter of coordinate system using quaternion parameters.

Specifically, the conversion module 405 may comprise an equation solver, which is configured to solve an conversion equation of coordinate system $V'=QVQ^{-1}$ to obtain the conversion parameter of coordinate system, wherein Q denotes the quaternion form for the conversion parameter of coordinate system, V denotes an expression of any vector in the object coordinate system, and V' denotes an expression of any vector in the terrestrial coordinate system. Accordingly, the equation solver substitutes the above relationships into the conversion equation of coordinate system to obtain the conversion parameter of coordinate system. The detailed solution can be referred to the illustration with reference to FIG. 2, which is not elaborated here.

Afterwards, the second determining module 407 receives the conversion parameter of coordinate system provided by the conversion module 405, and determines the attitude of the object according to the conversion, parameter of coordinate system. For example, the second determining module 407 may choose the terrestrial coordinate system as the basis coordinate system, and then the quaternion conversion parameter of coordinate system can be used as a quaternion parameter of the attitude of the object in the basis coordinate system.

Specifically, the conversion parameter of coordinate system Q represents the conversion relationship between the object coordinate system and the terrestrial coordinate system. And for the object at a location of the earth, the directions of the coordinate axes in the terrestrial coordinate system, such as the N axis, the E axis and the U axis in the ENU coordinate system, are certain. On the other hand, the object coordinate system is constant for the object itself. Therefore, the conversion parameter of coordinate system Q actually corresponds to the attitude of the object relative to the terrestrial coordinate system, and different conversion parameter of coordinate system Q represents different attitude of the object in the terrestrial coordinate system.

In the embodiment shown in FIG. 4, the apparatus for determining the attitude of the object further comprises a display module 410 for displaying the object according to the conversion parameter of coordinate system. For example, the display module 410 is a display interface, such as a display screen, which has a basis coordinate system like the terrestrial coordinate system. Then, the attitude of the object can be adjusted using the conversion parameter of coordinate system Q.

From the foregoing, according to the method and the apparatus for determining the attitude of the object, each operation for determining the attitude of the object is independent of another operation at a different time. In this way, the deviation accumulated due to the measurement error of the sensors is reduced, and the attitude of the object can be stably and accurately determined during a long period. Moreover, the invention applies a quaternion conversion parameter of coordinate system to determine the attitude of the object. As the quaternion equation has no singular point like the Euler angles, the invention also avoids the issue of Gimbal lock.

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A method, comprising:
   determining an attitude of an electromechanical object with a microprocessor, the determining including:
   receiving with the microprocessor a gravity acceleration signal from an accelerometer positioned on the object and a geomagnetic field signal from a magnetometer positioned on the object, the gravity acceleration signal and the geomagnetic field signal changing with the attitude of the object accordingly;
   determining with the microprocessor a gravity field representation in an object coordinate system according to the gravity acceleration signal, and determining with the microprocessor a geomagnetic field representation in the object coordinate system according to the geomagnetic field signal;
   calculating with the microprocessor a conversion parameter of a conversion coordinate system according to the gravity field representation and the geomagnetic field representation in the object coordinate system, the conversion coordinate system being between the object coordinate system and a terrestrial coordinate system; and
   determining the attitude of the object according to the conversion parameter of the conversion coordinate system;
   displaying a representation of the object on a display based on the conversion parameter of the conversion coordinate system, the display being coupled to the microprocessor.

2. The method as claimed in claim 1, wherein the gravity acceleration signal includes measurement values of gravity acceleration along three orthogonal measurement axes, and the geomagnetic field signal includes measurement values of geomagnetic field along three orthogonal measurement axes.

3. The method as claimed in claim 1, wherein determining the gravity field representation and the geomagnetic field representation further comprises:
   determining a relationship between the gravity field representation in the object coordinate system and a gravity field representation in the terrestrial coordinate system according to the gravity field representation in the object coordinate system; and determining a relationship between the geomagnetic field representation in the object coordinate system and a geomagnetic field representation in the terrestrial coordinate system according to the geomagnetic field representation in the object coordinate system.

4. The method as claimed in claim 3, wherein the terrestrial coordinate system is an east-north-up (ENU) coordinate system, a gravity field corresponds to an up axis of the ENU coordinate system, and a projection vector of a geomagnetic field on a horizon plane corresponds to a north axis of the ENU coordinate system.

5. The method as claimed in claim 1, wherein calculating the conversion parameter of the conversion coordinate system further comprises:

calculating the conversion parameter of the conversion coordinate system using quaternion parameters.

6. The method as claimed in claim 5, wherein calculating the conversion parameter of the conversion coordinate system further comprises:

solving a conversion equation of the conversion coordinate system $V'=QVQ^{-1}$ to obtain the conversion parameter of the conversion coordinate system, wherein Q denotes the quaternion form for the conversion parameter of the conversion coordinate system, V denotes an expression of any vector in the object coordinate system, and V' denotes an expression of any vector in the terrestrial coordinate system.

7. The method as claimed in claim 6, wherein solving the conversion equation of the conversion coordinate system further comprises:

determining a relationship between the gravity field representation in the object coordinate system and a gravity field representation in the terrestrial coordinate system according to the gravity field representation in the object coordinate system;

determining a relationship between the geomagnetic field representation in the object coordinate system and a geomagnetic field representation in the terrestrial coordinate system according to the geomagnetic field representation in the object coordinate system; and substituting the relationships into the conversion equation of the conversion coordinate system to obtain the conversion parameter of the conversion coordinate system.

8. The method as claimed in claim 1, wherein determining the attitude of the object according to the conversion parameter of the conversion coordinate system further comprises:

displaying the object according to the conversion parameter of the conversion coordinate system.

9. An apparatus for determining an attitude of an object, comprising:

an accelerometer on the object configured to measure a gravity field and generate a gravity acceleration signal;

a magnetometer on the object configured to measure a geomagnetic field and generate a geomagnetic field signal;

a microprocessor that includes:

a receiving module configured to receive the gravity acceleration signal and the geomagnetic field signal, the gravity acceleration signal and the geomagnetic field signal configured to change with the attitude of the object accordingly;

a first determining module configured to determine a gravity field representation in an object coordinate system according to the gravity acceleration signal, and determine a geomagnetic field representation in the object coordinate system according to the geomagnetic field signal;

a conversion module configured to calculate a conversion parameter of a conversion coordinate system according to the gravity field representation and the geomagnetic field representation in the object coordinate system, the conversion coordinate system being between the object coordinate system and a terrestrial coordinate system; and a second determining module configured to determine the attitude of the object according to the conversion parameter of the conversion coordinate system.

10. The apparatus as claimed in claim 9, wherein the gravity acceleration signal at least comprises measurement values of the gravity acceleration measured along three orthogonal measurement axes, and the geomagnetic field signal at least comprises measurement values of the geomagnetic field measured along three orthogonal measurement axes.

11. The apparatus as claimed in claim 9, wherein the first determining module is further configured to:

determine a relationship between the gravity field representation in the object coordinate system and a gravity field representation in the terrestrial coordinate system according to the gravity field representation in the object coordinate system; and determine a relationship between the geomagnetic field representation in the object coordinate system and a geomagnetic field representation in the terrestrial coordinate system according to the geomagnetic field representation in the object coordinate system.

12. The apparatus as claimed in claim 11, wherein the terrestrial coordinate system is an east-north-up (ENU) coordinate system, the gravity field corresponds to the up axis of the ENU coordinate system, and a projection vector of the geomagnetic field on the horizon plane corresponds to the north axis of the ENU coordinate system.

13. The apparatus as claimed in claim 9, wherein the conversion module is further configured to:

calculate the conversion parameter of the conversion coordinate system using quaternion parameters.

14. The apparatus as claimed in claim 13, wherein the conversion module further comprises an equation solver:

the equation solver is configured to solve a conversion equation of the conversion coordinate system $V'=QVQ^{-1}$ to obtain the conversion parameter of the conversion coordinate system, wherein Q denotes the quaternion form for the conversion parameter of the conversion coordinate system, V denotes an expression of any vector in the object coordinate system, and V' denotes an expression of any vector in the terrestrial coordinate system.

15. The apparatus as claimed in claim 14, wherein the first determining module is further configured to:

determine a relationship between the gravity field representation in the object coordinate system and a gravity field representation in the terrestrial coordinate system according to the gravity field representation in the object coordinate system;

determine a relationship between the geomagnetic field representation in the object coordinate system and a geomagnetic field representation in the terrestrial coordinate system according to the geomagnetic field representation in the object coordinate system; and the equation solver is further configured to substitute the relationships into the conversion equation of the conversion coordinate system to obtain the conversion parameter of the conversion coordinate system.

16. The apparatus as claimed in claim 9, further comprising:
a display module, for displaying the object according to the conversion parameter of the conversion coordinate system.

* * * * *